(12) United States Patent
Ribes

(10) Patent No.: US 6,522,123 B2
(45) Date of Patent: Feb. 18, 2003

(54) APPARATUS FOR MEASURING CURRENT FLOWING IN A CONDUCTOR

(75) Inventor: Laurent Ribes, Osny (FR)

(73) Assignee: Sagem SA, Paris (FR)

( * ) Notice: Subject to any disclaimer, the term of this patent is extended or adjusted under 35 U.S.C. 154(b) by 49 days.

(21) Appl. No.: 09/730,856

(22) Filed: Dec. 7, 2000

(65) Prior Publication Data

US 2001/0003419 A1 Jun. 14, 2001

(30) Foreign Application Priority Data

Dec. 9, 1999 (FR) .............................. 99 15542

(51) Int. Cl.[7] .............................. G01R 1/14; G01R 1/02; G01R 27/08; G01D 18/00
(52) U.S. Cl. ..................... 324/126; 324/130; 324/713; 702/85
(58) Field of Search ................................ 324/126, 130, 324/74, 103, 104, 123 R, 601, 128, 713; 702/85; 320/132

(56) References Cited

U.S. PATENT DOCUMENTS

| | | | | |
|---|---|---|---|---|
| 4,584,525 A | * | 4/1986 | Harnden, Jr. et al. | 324/126 |
| 4,714,893 A | * | 12/1987 | Smith-Vaniz | 324/126 |
| 5,426,360 A | * | 6/1995 | Maraio et al. | 324/126 |
| 5,804,979 A | * | 9/1998 | Lund et al. | 324/713 |
| 6,131,074 A | * | 10/2000 | Kawai | 702/107 |
| 6,331,762 B1 | * | 12/2001 | Bertness | 320/134 |

* cited by examiner

*Primary Examiner*—N. Le
*Assistant Examiner*—Anjan K. Deb
(74) *Attorney, Agent, or Firm*—Foley & Lardner

(57) ABSTRACT

An apparatus for measuring current carried by a conductor has a differential voltage amplifier having inputs for connection to the conductor at two spaced-apart points thereof, constituting the ends of a segment. A circuit which converts an output voltage of the amplifier into a current value incorporates a microcontroller associated with a programmable memory storing a calibration table in digital form.

7 Claims, 1 Drawing Sheet

APPARATUS FOR MEASURING CURRENT FLOWING IN A CONDUCTOR

BACKGROUND OF THE INVENTION

The invention relates to apparatus for measuring current flowing in an electrical conductor, whether DC or AC.

A conventional solution for measuring such a current, particularly when it is DC, consists in cutting the cable, in interposing a known resistance between the cut ends, and in measuring the potential difference across the terminals of the resistance.

That solution requires the cable to be cut and a resistive element to be inserted between its cut ends.

SUMMARY OF THE INVENTION

It is an object of the invention to provide apparatus of a type avoiding that requirement and for this purpose making use of the performance of recent voltage amplifiers and the possibility of digitally processing the analog data supplied by such an amplifier.

To this end, it is provided apparatus for measuring DC or AC current carried by a conductor, comprising a voltage differential amplifier having two inputs for connection to the conductor each at one of two spaced-apart points of the conductor thereof, constituting the ends of a segment and a measurement circuit. That circuit is apt to convert an output voltage of the amplifier into an electrical current value. It further includes a microcontroller and a programmable memory for storing a calibration table in digital form. It may further include a generator for generating a calibration current at a frequency sufficiently different from a frequency of the current to be measured for enabling the calibration current to be separated from the current to be measured by filter means, and means for determining or correcting the calibration table responsive to a voltage measured at the calibration current frequency.

With DC, the circuit provides the magnitude of the current directly. With AC, a converter is provided. The invention is particularly adapted to measuring high currents.

Such measurement apparatus avoids any need to cut the cable and does not have any incidence on the connections between successive lengths of the conductor.

Measurement is based on the relationship which exists between the output voltage Vs from the amplifier and the current I carried by the conductor:

$$Vs=(1+\epsilon)A.Vc$$

with Vc=R.I where:
I is the current in the conductor;
R is the resistance of the segment of conductor;
$\epsilon$ is a coefficient that depends on static errors, is always much less than 1, and it stored; and
A is the current/voltage amplification factor.

When the temperature of the conductor is liable to vary sufficiently to have significant influence on the resistivity and thus on the resistance of the segment, provision is made for a temperature sensor and for a correction to be calculated that takes account of the way resistance varies as a function of temperature.

Static errors can be measured in a workshop when the measurement apparatus is definitively installed on the conductor. It is also possible to perform periodic calibration by providing in the apparatus a current generator delivering a calibration current of known magnitude at a frequency that enables the calibration current to be distinguished from the current that is to be measured, which current may be DC or AC. The voltage measured when passing a known current that comes from a generator which is not subject to temperature drift makes it possible to determine the required calibration factors and possibly correction factors as a function of the temperature. A temperature sensor is no longer necessary if calibration by means of the current generator is performed often enough or just before each measurement.

The circuits of the apparatus advantageously constitute an assembly which is molded onto the conductor segment after that segment has been stripped to allow the connections to be made thereto.

The above characteristics, and others, will appear more clearly on reading the following description of particular embodiments, given as non-limiting examples;

DETAILED DESCRIPTION

Figure 1:
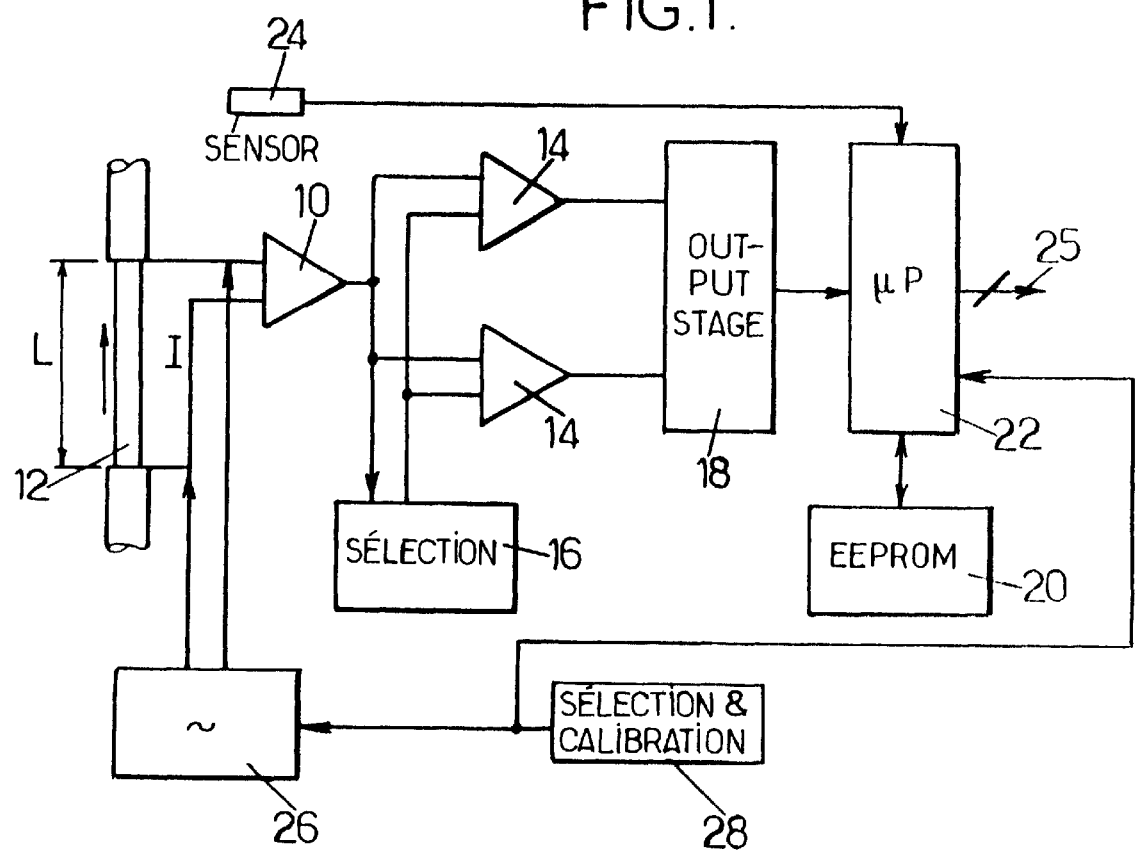
FIG. 1 is a block diagram showing the parameters involved in the measurement.

The apparatus schematically shown in FIG. 1 comprises a differential preamplifier 10 whose inputs are connected to the conductor at opposite ends of a segment 12 of length L. In the embodiment shown diagrammatically, the preamplifier is followed by two amplifiers 14 and 16, one or other of which is put into operation depending on the magnitude of the current so as to increase the range over which measurements can be made. This number is not limiting. The number of amplifiers depends on the measurement range and also on whether or not the current, if DC, can reverse. Selection can be performed by a selector circuit 16 as a function of the voltage output by the preamplifier 10. An analog output stage 18 feeds a microcontroller 22 which includes an input analog-to-digital converter and which is associated with a memory 20 for storing a calibration table. A voltage-stabilized power supply (not shown) is connected to the active components.

The resistance R of the conductor segment can be written as follows:

$$R=\rho_0(1+\alpha.\Delta\theta)L/S$$

where:
$\rho_0$ is its resistivity at a calibration temperature, e.g. 20° C.;
S is its cross-section;
$\alpha$ is the mean temperature coefficient in the intended operating range; and
$\Delta\theta$ is the difference between the measurement temperature and the calibration temperature.

Variations in the length L of the cable are generally negligible over the intended measurement range.

The current Ic carried by the cable is related to the output voltage Vs after amplification by the nominal factor A according to the following relationship:

$$Vs=(1+\epsilon)A.Ic(1+\alpha.\Delta\theta).R_0 \qquad (1)$$

where $R_0$ is the resistance at the reference temperature and $\epsilon$ is a static error stored in the form of a table since it can depend on Vs. The value of Ic is thus written as follows:

$$Ic = Vs/[(1+\epsilon)A(1+\alpha.\Delta\theta)].R_0 \quad (2)$$

To enable the microcontroller 22 to perform temperature correction, the apparatus includes a temperature sensor 24 placed in the vicinity of the segment 12. The temperature measured in this way, put into digital form, is taken into account by the microcontroller to calculate the correction term $1+\alpha.\Delta\theta$ in equation (2).

In general, the apparatus is mounted in permanent manner on a segment of cable and calibration is performed in factory. This implies storing $R_0$ and the mean value $\alpha$ of the temperature coefficient over the intended measurement range. With copper, for example, the mean temperature coefficient is 0.004 over the range going from −20° C. to 60° C. In the common circumstance of a copper conductor, variations in length over this temperature range are negligible since the linear expansion coefficient is then $1.7 \times 10^{-5}$ mm/° C.

Static errors $\epsilon$ generally change little as a function of temperature so it suffices to measure the value thereof over a series of current values that are sufficiently close and to store them. This operation can be performed by causing well-determined currents to pass along the segment at a stabilized temperature and by calculating each time the corresponding value for $\epsilon$.

During each measurement, the microcontroller 22 determines an appropriate value for $\epsilon$ responsive to Vs, possibly interpolating between the values stored in the memory 20. It also calculates the temperature correction factor $1+\alpha.\Delta\theta$ and it delivers the value of the current on its output 25 in digital form. By way of example, this output can be applied to the input circuit of a display. It can also be used as an input to a regulation or control member.

An important application lies in measuring battery current, in particular for a motor vehicle having an alternator-starter.

In a modified embodiment, the apparatus further includes a current generator 26 connected to the segment of cable so as to cause it to carry a determined current or a current that has a time sequence of determined levels. A component 28 enables the apparatus to be given two operating modes. One of the two modes is a calibration mode during which the generator supplies an alternating voltage at a frequency that is quite different from the frequency to be measured in the conductor, for example a frequency in the kHz range when the apparatus is intended to measure DC or AC at 50 Hz or 60 Hz. When calibration is to be performed while a current is being carried by the conductor, a frequency filter is inserted at the input to the preamplifier 10.

The component 28 can be manually controlled so as to authorize calibration on demand, or it can be constituted by a sequencer.

Figure 2:
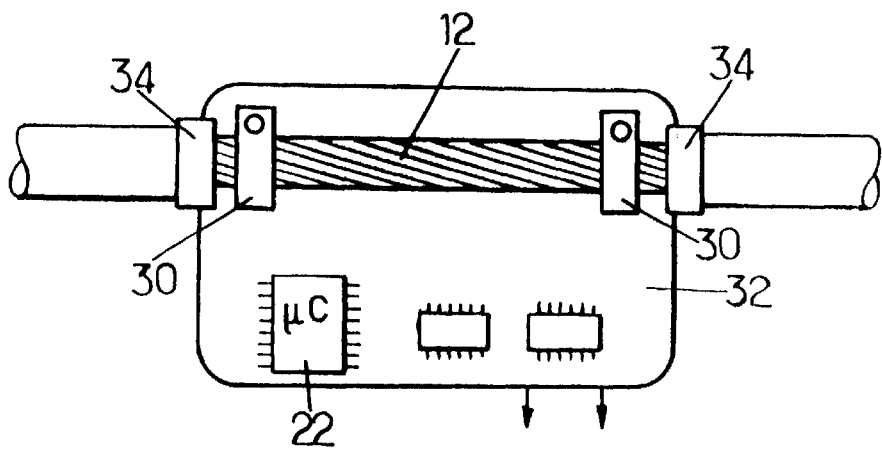
FIG. 2 is a diagram showing one possible physical structure of the apparatus.

The physical structure of the apparatus can be as shown in FIG. 2. The conductor 12 is stripped over a portion which receives voltage-taking clamps 30. A card 32 carriers the active components of the system. At the ends of the segment, the insulation of the cable is connected to the card by molded gaskets 34. A cover (not shown) can close the apparatus and the cover can carry a display unit.

What is claimed is:

1. Apparatus for measuring current carried by a conductor, the apparatus comprising;
    a segment of said conductor having two ends,
    a differential voltage amplifier having inputs permanently connected to the conductor at two spaced-apart points thereof, constituting said ends of said conductor segment, and providing an output signal representative of a voltage across said ends, and
    a circuit for converting said output signal of the differential voltage amplifier into a display of said electrical current, said circuit incorporating:
        at least two amplifiers in parallel relation, each receiving said output signal
        a selector connected to receive said output signal and to selectively put into operation one of said amplifiers responsive to a magnitude of the current,
        an analog to digital converter connected to receive an output of that of the amplifiers which is in operation,
        a programmable memory for storing a calibration table in digital form for correcting static errors as a function of the current, and
        a microcontroller connected to said programmable memory and receiving a digital output of said analog to digital converter and arranged to drive a display unit.

2. Apparatus according to claim 1 further including a temperature sensor and correction means arranged to take account of a coefficient of resistivity variation of the conductor as a function of temperature.

3. Apparatus according to claim 1, further including a calibration current generator for generating a predetermined calibration current at a frequency distinguishable from that of the electrical current to be measured, and means for determining or correcting the calibration table responsive to a voltage measured at the calibration current frequency.

4. In a vehicle provided with an alternator-starter and a battery, an apparatus according to claim 1 connected to measure battery current.

5. Apparatus for measuring DC or AC current carried by a conductor, comprising:
    a segment of said conductor having two ends,
    a differential voltage amplifier having two inputs connected to two spaced-apart points of the conductor, constituting ends of said segment, and
    a measurement circuit for converting an output voltage of the amplifier into an electrical current value, said measurement circuit including an input analog/digital converter, a microcontroller, a programmable memory for storing a calibration table in digital form for correcting static errors as a function of the current, a generator for generating a calibration current at a frequency sufficiently different from a frequency of the current to be measured for enabling the calibration current to be separated from the current to be measured by filter means, and means for determining or correcting the calibration table responsive to a voltage measured at the calibration current frequency.

6. Apparatus according to claim 5 further including a temperature sensor and correction means arranged to take account of a coefficient of resistivity variation of the conductor as a function of temperature.

7. Apparatus according to claim 5 comprising an assembly molded onto the segment and including said differential voltage amplifier and measurement circuit.

* * * * *